(12) United States Patent
Buckley (10) Patent No.: US 12,218,254 B2
(45) Date of Patent: Feb. 4, 2025

(54) SEMICONDUCTOR DIODE AND METHOD OF MANUFACTURING SUCH A DIODE

(71) Applicant: Commissariat à l'Énergie Atomique et aux Énergies Alternatives, Paris (FR)

(72) Inventor: Julien Buckley, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 156 days.

(21) Appl. No.: 17/381,043

(22) Filed: Jul. 20, 2021

(65) Prior Publication Data

US 2022/0037538 A1   Feb. 3, 2022

(30) Foreign Application Priority Data

Jul. 28, 2020 (FR) ...................................... 2007953

(51) Int. Cl.
*H01L 29/861* (2006.01)
*H01L 29/20* (2006.01)

(52) U.S. Cl.
CPC ........ *H01L 29/861* (2013.01); *H01L 29/2003* (2013.01)

(58) Field of Classification Search
CPC . H01L 29/861; H01L 29/2003; H01L 29/407; H01L 29/452; H01L 29/66204;

(Continued)

(56) References Cited

U.S. PATENT DOCUMENTS 9,634,128 B2   4/2017 Ogura et al.
2013/0099285 A1*  4/2013 Hwang ............... H01L 29/1608
                                                      257/E29.246

(Continued)

FOREIGN PATENT DOCUMENTS

CN      102244094 A  * 11/2011 ............. H01L 29/12
JP      2015-023073 A   2/2015
JP      2019193095 A  * 10/2019 ............. H01L 29/20

OTHER PUBLICATIONS

Chang et al., III-V semiconductor MOS interface structure, Nov. 16 (2011), machine translation of CN 102244094 A, pp. 1-4. (Year: 2011).*

(Continued)

*Primary Examiner* — Natalia A Gondarenko
(74) *Attorney, Agent, or Firm* — Wolf, Greenfield & Sacks, P.C.

(57) ABSTRACT

A semiconductor diode, including: a first doped semiconductor region of a first conductivity type; a second doped semiconductor region of a second conductivity type opposite to the first conductivity type, arranged on top of and in contact with the upper surface of the first semiconductor region; a first conductive region arranged on top of and in contact with the upper surface of the second semiconductor region, the first conductive region comprising a through opening opposite a portion of the second semiconductor region; a second conductive region made of a material different from that of the first conductive region, coating the upper surface of the second semiconductor region opposite said opening; a cavity extending through the second conductive region and through the second semiconductor region opposite a portion of said opening; a dielectric region coating the lateral walls and the bottom of the cavity; a third conductive region coating the dielectric region on the lateral (Continued)

walls and at the bottom of the cavity, the third conductive region being further electrically in contact with the first and second conductive regions.

13 Claims, 5 Drawing Sheets

(58) Field of Classification Search
CPC ......... H01L 29/8613; H01L 29/66712–66734; H01L 29/7802–7815; H01L 29/66666; H01L 29/7827–7828; H01L 29/78642; H01L 27/085–098; H01L 27/0922; H01L 27/105; H01L 27/11526; H01L 27/11546; H01L 29/872; H01L 29/247; H01L 29/24; H01L 29/41; H01L 29/47; H01L 29/204; H01L 29/36; H01L 29/8725; H01L 29/1608; H01L 29/0649; H01L 29/66068; H01L 29/1095; H01L 29/7806; H01L 29/7395; H01L 29/782; H01L 29/8605; H01L 29/7839; H01L 29/808; H01L 29/7392; H01L 29/761; H01L 29/66143; H01L 29/0814; H01L 29/4236
USPC ..................................................... 257/76, 77
See application file for complete search history.

(56) References Cited

U.S. PATENT DOCUMENTS

| 2013/0328120 | A1  | 12/2013 | Ueno et al. | |
|---|---|---|---|---|
| 2014/0264369 | A1* | 9/2014 | Padmanabhan | ..... H01L 27/0688 438/172 |
| 2015/0035047 | A1  | 2/2015 | Jin | |
| 2016/0163792 | A1* | 6/2016 | Oka | ..................... H01L 29/8613 257/636 |
| 2016/0254392 | A1* | 9/2016 | Hasegawa | ............. H01L 29/456 257/77 |
| 2016/0276172 | A1* | 9/2016 | Ina | ........................ H01L 29/452 |
| 2018/0269335 | A1* | 9/2018 | Hasegawa | ............... H01L 29/47 |
| 2022/0376055 | A1* | 11/2022 | Shibata | ............. H01L 29/41758 |

OTHER PUBLICATIONS

Preliminary Search Report for French Application No. 2007953, dated Apr. 7, 2021.
Baliga, Excerpts from Fundamentals of power semiconductor devices. Springer Science & Business Media; Apr. 2, 2010:285-9.
Kajitani et al., A high current operation in a 1.6 kV GaN-based trenched junction barrier Schottky (JBS) Diode. Extended Abstracts of the 2015 International Conference on Solid State Devices and Materials (SSDM). Sep. 2015:1056-7.
Koehler et al., Vertical GaN junction barrier Schottky diodes by Mg implantation and activation annealing. 2016 IEEE 4th Workshop on Wide Bandgap Power Devices and Applications (WiPDA). Nov. 7, 2016:344-6.
Li et al., Design and realization of GaN trench junction-barrier-Schottky-diodes. IEEE Transactions on Electron Devices. Feb. 21, 2017;64(4):1635-41.
Oka et al., 1.8 mΩ·cm² vertical GaN-based trench metal-oxide-semiconductor field-effect transistors on a free-standing GaN substrate for 1.2-kV-class operation. Applied Physics Express. Apr. 14, 2015;8(5):054101.
Zhang et al., Vertical GaN junction barrier Schottky rectifiers by selective ion implantation. IEEE Electron Device Letters. Jun. 27, 2017;38(8):1097-100.

* cited by examiner

SEMICONDUCTOR DIODE AND METHOD OF MANUFACTURING SUCH A DIODE

CROSS-REFERENCE TO RELATED APPLICATION

This application claims priority to French Patent Application 2007953, filed Jul. 28, 2020, the contents of which is incorporated herein by reference in its entirety.

TECHNICAL BACKGROUND

The present disclosure generally concerns the field of electronic power components, and more particularly aims at a semiconductor diode and a method of manufacturing such a diode.

PRIOR ART

Many power semiconductor diode structures have already been provided.

Example of such structures are particularly described in the articles entitled "A High Current Operation in a 1.6 kV GaN-based Trenched Junction Barrier Schottky (JBS) Diode" (R. Kajitani et al., International Conference on Solid State Devices and Materials, 2015, pp. 1056-1057), "Vertical GaN Junction Barrier Schottky Diodes by Mg Implantation and Activation Annealing" (A. D. Koehler et al., 2016 IEEE 4th Workshop on Wide Bandgap Power Devices and Applications, pp. 344-346), "Design and Realization of GaN Trench Junction-Barrier-Schottky-Diodes" (W. Li et al., IEEE Transactions on Electron Devices, vol. 64, no. 4, pp. 1635-1641, April 2017), and "Vertical GaN Junction Barrier Schottky Rectifiers by Selective Ion Implantation" (Y. Zhang et al., IEEE Electron Device Letters, vol. 38, no. 8, pp. 1097-1100, August 2017).

Known structures however have various disadvantages that it would be desirable to totally or partly overcome.

SUMMARY

Thus, an embodiment provides a semiconductor diode comprising:
- a first doped semiconductor region of a first conductivity type;
- a second doped semiconductor region of a second conductivity type opposite to the first conductivity type, arranged on top of and in contact with the upper surface of the first semiconductor region;
- a first conductive region arranged on top and in contact with the upper surface of the second semiconductor region, the first conductive region comprising a through opposite a portion of the second semiconductor region;
- a second conductive region made of a material different from that of the first conductive region, coating the upper surface of the second semiconductor region opposite said opening;
- a cavity extending through the second conductive region and through the second semiconductor region opposite a portion of said opening;
- a dielectric region coating the lateral walls and the bottom of the cavity;
- a third conductive region coating the dielectric region on the lateral walls and at the bottom of the cavity, the third conductive region being further electrically in contact with the first and second conductive regions.

According to an embodiment, the second conductive region is in contact, by its lower surface, with the upper surface of the second semiconductor region opposite said opening.

According to an embodiment, a third semiconductor region of the first conductivity type forms an interface between the second conductive region and the second semiconductor region opposite said opening.

According to an embodiment, the dielectric region covers the upper surface of the second conductive region opposite said opening.

According to an embodiment, the dielectric region has an equivalent silicon oxide thickness smaller than 5 nm on the lateral walls of the cavity.

According to an embodiment, the second conductive region has a work function smaller than that of the first conductive region.

According to an embodiment, the second conductive region has a work function substantially equal to the electron affinity of the material of the second semiconductor region.

According to an embodiment, the third conductive region has a work function smaller than or equal to 5 V.

According to an embodiment, each of the first and second semiconductor regions comprises gallium nitride.

According to an embodiment, the first conductive region comprises platinum, palladium, a nickel-gold alloy, a palladium-gold alloy, or a palladium-nickel-gold alloy.

According to an embodiment, the second conductive region comprises titanium, aluminum, or a titanium-aluminum alloy.

According to an embodiment, the third conductive region is made of titanium nitride.

According to an embodiment, the diode further comprises a fourth conductive region in contact with the lower surface of the first semiconductor region.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the possible uses of the described diodes have not been detailed, the described embodiments being compatible with all or most of known uses of power semiconductor diodes.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
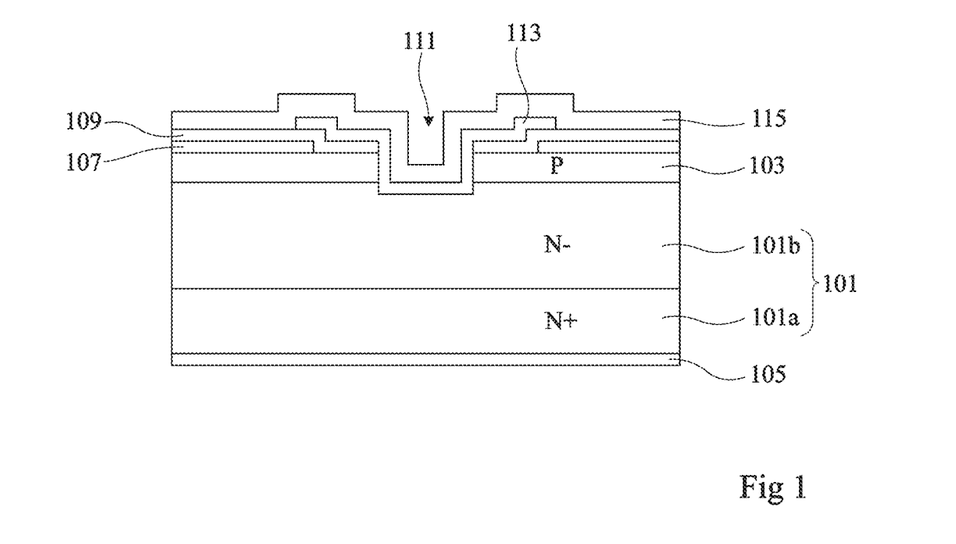
FIG. 1 is a cross-section view illustrating an example of a semiconductor diode structure according to an embodiment.

FIG. 1 is a cross-section view illustrating an example of a semiconductor diode structure according to an embodiment.

The diode of FIG. 1 comprises a first N-type doped semiconductor region 101 and, on top of and in contact with the upper surface of region 101, a second P-type doped semiconductor region 103. Regions 101 and 103 respectively form a cathode semiconductor region and an anode semiconductor region of the diode.

In the shown example, region 101 comprises a relatively heavily N-type doped lower region 101a and, on top of and in contact with the upper surface of region 101a, a relatively lightly-doped N-type upper region 101b. In this example, region 103 is in contact, by its lower surface, with the upper surface of region 101b.

Each of regions 101a, 101b, and 103 may be made of gallium nitride (GaN), or of an alloy based on gallium nitride. The N-type doping level of region 101b is for example in the range from $10^{15}$ to $10^{17}$ atoms/cm$^3$. The N-type doping level of region 101a is for example in the range from $10^{18}$ to $10^{20}$ atoms/cm$^3$. The P-type doping level of region 103 is for example in the range from $5*10^{17}$ to $5*10^{20}$ atoms/cm$^3$. The thickness of region 101b is for example in the range from 1 to 5 µm. The thickness of region 101a is for example in the range from 200 µm to 400 µm. The thickness of region 103 is for example in the range from 0.2 µm to 2 µm.

The diode of FIG. 1 further comprises, on its lower surface side, a conductive region 105, for example, made of metal, in contact, by its upper surface, with the lower surface of semiconductor region 101. Conductive region 105 forms a cathode electrode of the diode. In this example, conductive region 105 is in contact, by its upper surface, with the lower surface of region 101a. Conductive region 105 forms an ohmic contact with the lower surface of semiconductor region 101a. Conductive region 105 is for example made of titanium, of aluminum, of gold, of nickel, or of an alloy of one or a plurality of these materials.

The diode of FIG. 1 further comprises, on its upper surface side, a conductive region 107, for example, made of metal, in contact, by its lower surface, with the upper surface of semiconductor region 103. Conductive region 107 forms an ohmic contact, for holes, with the upper surface of semiconductor region 103. As an example, region 107 may be made of platinum, of palladium, of a nickel-gold alloy, of a palladium-gold alloy, or of a palladium-nickel-gold alloy. The thickness of conductive region 107 is for example in the range from 100 nm to 1.5 µm.

Conductive region 107 comprises a through opening opposite a portion of semiconductor region 103, for example opposite a central portion (in top view) of region 103. In other words, a portion of semiconductor region 103 is not covered with conductive region 107.

The diode of FIG. 1 further comprises a conductive region 109 made of a material different from that of region 107, coating the upper surface of semiconductor region 103 opposite the area of interruption of region 107. In the example of FIG. 1, conductive region 109 is in contact, by its lower surface, with the upper surface of semiconductor region 103 opposite the interruption area of conductive region 107. Further, in this example, conductive region 109 extends on top of and in contact with the upper surface of conductive region 107 outside of the area of interruption of conductive region 107. The material of conductive region 109 preferably has a work function smaller than that of the material of conductive region 107. As an example, the material of region 109 has a work function substantially equal to the electron affinity of the semiconductor material of region 103, for example, in the order of 4 eV for gallium nitride. As an example, region 109 may be made of titanium, of aluminum, or of a titanium-aluminum alloy. The thickness of conductive region 109 is for example in the range from 40 nm to 150 nm.

The diode of FIG. 1 further comprises, on its upper surface side, opposite a portion of the area of interruption of conductive region 107, for example, opposite a central portion of the opening formed in conductive region 107, a trench or cavity 111 vertically extending through conductive region 109 and semiconductor region 103, and emerging into or onto the upper surface of semiconductor region 101b.

The diode further comprises a dielectric region 113, for example, made of silicon oxide (SiO$_2$), of silicon nitride (SiN), of hafnium oxide (HfO$_2$), of alumina (Al$_2$O$_3$), or of any other adapted dielectric material, coating the lateral walls and the bottom of cavity 111. Dielectric region 113 is particularly in contact with the sides of regions 103 and 109 at the level of the lateral walls of cavity 111, and with region 101b at the level of the bottom of cavity 111. In the shown example, dielectric region 113 further extends on top of and in contact with the upper surface of conductive region 109 outside of cavity 111. More particularly, in this example, dielectric region 113 extends on top of and in contact with the upper surface of conductive region 109 opposite the opening formed in conductive region 107, and opposite a portion of the stack formed by conductive regions 107 and 109 at the periphery of said opening. A portion of the stack formed by conductive regions 107 and 109 is however not covered with dielectric region 113.

The diode of FIG. 1 further comprises, on its upper surface side, a conductive region 115 extending on top of and in contact with dielectric region 113 on the lateral walls and at the bottom of cavity 111. The conductive region further extends on top of and in contact with the upper surface of the structure outside of cavity 111. More particularly, conductive region 115 extends on top of and in contact with the upper surface of conductive region 109 opposite a portion of region 109 which is not covered with dielectric region 113. Upper conductive region 115 forms an anode electrode of the diode. Conductive region 115 is for example made of titanium nitride.

Figure 2:
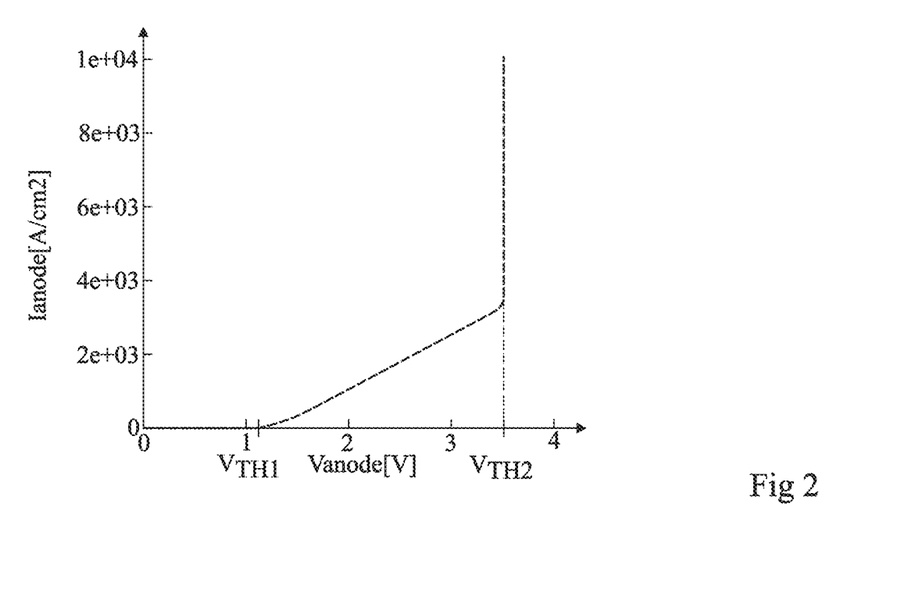
FIG. 2 is a diagram illustrating the current-vs.-voltage characteristic of a diode of the type described in relation with FIG. 1.

FIG. 2 is a diagram illustrating the current-vs.-voltage characteristics of a diode of the type described in relation with FIG. 1. FIG. 2 more particularly shows the variation of the surface density of current Ianode (in A/cm², in ordinates) in the diode according to voltage Vanode (in V, in abscissas) applied between the anode electrode 115 and the cathode electrode 105 of the diode.

Below a first voltage threshold $V_{TH1}$, in the order of 1 V in the shown example, the current flowing between the anode and the cathode of the diode is zero or negligible.

When voltage Vanode reaches threshold $V_{TH1}$, a vertical inversion channel forms in the vicinity of the sides of P-type semiconductor region 103, at the level of the lateral walls of cavity 111. The stack of dielectric and conductive regions 113 and 115 indeed forms, on the lateral walls of cavity 111, a vertical insulated conductive gate which, when biased beyond voltage $V_{TH1}$, induces an inversion of semiconductor region 103 in the vicinity of the lateral walls of the cavity. Conductive region 115 simultaneously biases the vertical gate and conductive region 109. Conductive region 109, in contact, by its lower surface, with the upper surface of semiconductor region 103, enables to collect the electrons of the inversion channel. A current then flows between the anode and the cathode of the diode. This current increases monotonously, for example linearly, with voltage Vanode, up to a second voltage threshold $V_{TH2}$, greater than threshold $V_{TH1}$.

When voltage Vanode reaches threshold $V_{TH2}$, holes are injected from P-type region 103 to N-type region 101b, inducing a modulation of the conductivity of region 101b. More particularly, the injected holes have the effect of electrostatically attracting electrons from the cathode, increasing the conductivity of region 101b. A strong current then starts flowing between the anode and the cathode of the diode, via the PN junction formed at the interface between regions 103 and 101.

Thus, the diode of FIG. 1 has two conduction modes, a so-called nominal conduction mode, allowing a fast switching from the off state to the on state and adapted to conducting relatively low currents, and a so-called overload mode, having a higher turn-on threshold and adapted to conducting relatively high currents. The structure of FIG. 1 further enables to benefit from particularly low off-state leakage currents.

FIGS. 3A to 3H are cross-section views illustrating successive steps of an example of a method of manufacturing a semiconductor diode according to an embodiment.

Figure 3A:
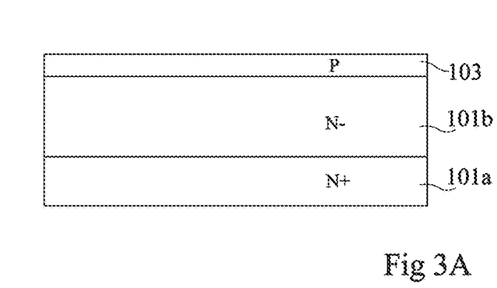
FIGS. 3A to 3H are cross-section views illustrating successive steps of an example of a method of manufacturing a semiconductor diode according to an embodiment.

FIG. 3A illustrates an initial structure comprising a stack of a relatively heavily N-type doped semiconductor layer 101a, corresponding to the region 101a of the diode of FIG. 1, of a relatively lightly N-type doped semiconductor layer 101b, corresponding to the region 101b of the diode of FIG. 1, and a P-type doped semiconductor layer 103, corresponding to the region 103 of the diode of FIG. 1. As an example, region 101b is formed by epitaxy on top of and in contact with the upper surface of region 101a, after which region 103 is formed by epitaxy on top of and in contact with the upper surface of region 101b.

Figure 3B:
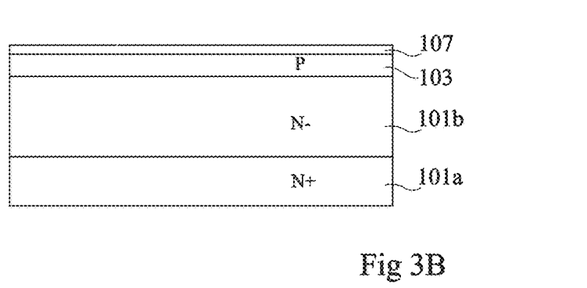

FIG. 3B illustrates the structure obtained at the end of a step of deposition of a conductive layer 107, corresponding to the conductive region 107 of the diode of FIG. 1, on top of and in contact with the upper surface of semiconductor layer 103. At this stage, layer 107 continuously extends, for example, across a substantially uniform thickness, over the entire upper surface of semiconductor layer 103. Preferably, to favor the electric contact between semiconductor layer 103 and conductive layer 107, semiconductor layer 103 comprises a heavily P-type doped surface portion (not detailed in the drawings), for example, having a doping level greater than or equal to $10^{20}$ atoms/cm³. As an example, the heavily-doped surface portion may be made of gallium nitride and have a thickness in the order of 10 nm. As a variant, the heavily-doped surface portion may be made of gallium-indium nitride, for example, with an indium rate in the range from 10% to 30%, and have a thickness in the range from 2 to 10 nm.

Figure 3C:
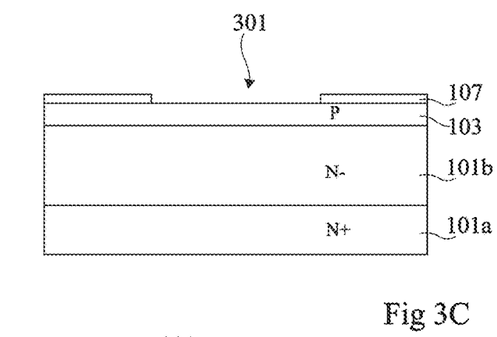

FIG. 3C illustrates the structure obtained at the end of a step of local removal of conductive layer 107 and opposite a portion of semiconductor layer 103, to form in layer 107 a through opening 301 emerging onto the upper surface of semiconductor layer 103. Opening 301 is for example located opposite a central portion (in top view) of semiconductor layer 103. As an example, opening 301 is formed by photolithography and etching. The lateral dimensions of opening 301 are for example in the range from 1 to 20 μm, for example from 2 to 5 μm.

Figure 3D:
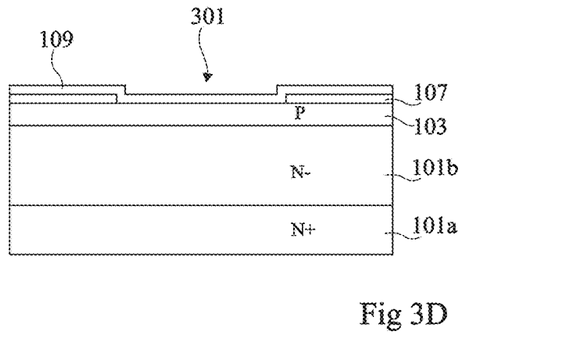

FIG. 3D illustrates the structure obtained at the end of a step of deposition of a conductive layer 109, corresponding to the conductive region 109 of the diode of FIG. 1, on top of and in contact with the upper surface of the structure of FIG. 3C. At this stage, layer 109 extends continuously, for example across a substantially uniform thickness, over the entire upper surface of the structure, that is, on top of and in contact with the upper surface of conductive layer 107 outside of opening 301, on top of and in contact with the sides of conductive layer 107 at the level of the lateral walls of opening 301, and on top of and in contact with the upper surface of semiconductor layer 103 at the bottom of opening 301.

Figure 3E:
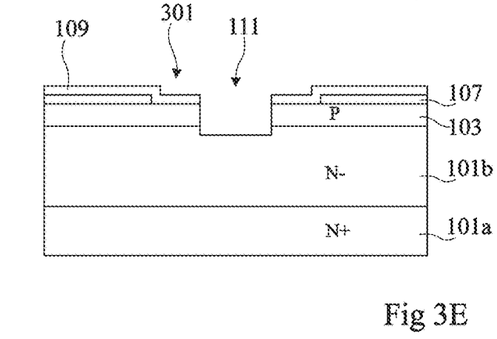

FIG. 3E illustrates the structure obtained at the end of a step of local etching of layers 109 and 103 opposite opening 301, to form the cavity 111 of the diode of FIG. 1. The lateral dimensions of cavity 111 are smaller than those of opening 301. In the shown example, cavity 111 is located opposite a central portion of cavity 301. As an example, the distance in top view, between the lateral walls of opening 301 and the lateral walls of cavity 111, is in the range from 0.2 to 5 μm. In this example, cavity 111 emerges onto the upper surface or into semiconductor layer 101b.

Figure 3F:
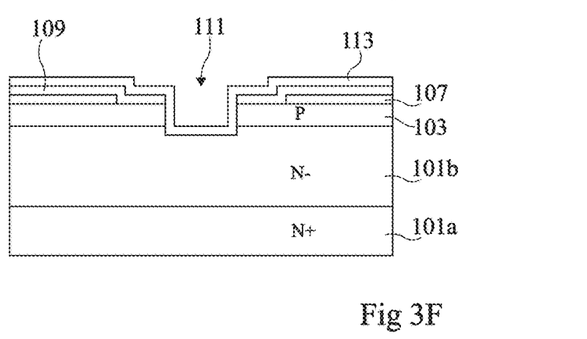

FIG. 3F illustrates the structure obtained at the end of a step of deposition of a dielectric layer 113 on top of and in contact with the upper surface of the structure of FIG. 3E. At this stage, layer 113 extends continuously, for example, across a substantially uniform thickness, over the entire upper surface of the structure, that is, on top of and in contact with the upper surface of conductive layer 109 outside of cavity 111, on top of and in contact with the sides of layers 109 and 103 at the level of the lateral walls of cavity 111, and on top of and in contact with the upper surface of semiconductor layer 101b at the bottom of cavity 111.

Figure 3G:
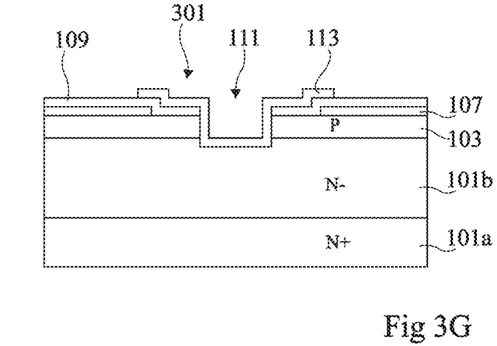

FIG. 3G illustrates the structure obtained at the end of a step of local removal, for example, by photolithography and etching, of dielectric layer 113, to only keep a portion of layer 113 corresponding to the dielectric region 113 of the diode of FIG. 1. More particularly, in this example, layer 113 is kept opposite cavity 111 and opening 301, as well as above a portion of conductive region 107 at the periphery of opening 301. Dielectric layer 113 is however entirely removed to expose the upper surface of conductive layer 109 opposite a peripheral portion of the structure. Preferably, the thickness of dielectric layer 113 is relatively low to favor the forming of a vertical inversion channel at the level of the sides of semiconductor layer 103, and thus obtain a two-threshold characteristic of the type shown in FIG. 2. As an example, the equivalent silicon oxide thickness of dielectric layer 113 (equal to $(\varepsilon_{SiO2}/\varepsilon_{diel})*t_{diel}$, where $\varepsilon_{SiO2}$, $\varepsilon_{diel}$, and $t_{diel}$ respectively designate the dielectric constant of silicon oxide, the dielectric constant of the material of layer 113, and the thickness of layer 113) is smaller than or equal to 5 nm. Preferably, the physical thickness of layer 113 is greater than or equal to 1 nm to limit leakage currents through layer 113.

Figure 3H:
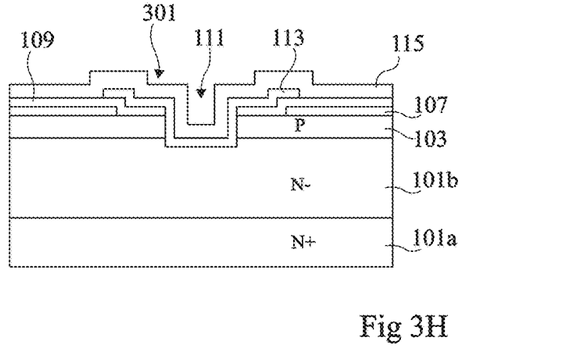

FIG. 3H illustrates the structure obtained at the end of a step of deposition of a conductive layer 115, corresponding to the anode electrode 115 of the diode of FIG. 1, on the upper surface of the structure of FIG. 3G. In this example, layer 115 extends continuously, for example, over a substantially uniform thickness, over the entire upper surface of the structure, that is, on top of and in contact with the upper surface of conductive layer 109 at the periphery of dielectric layer 113, and on top of and in contact with the upper surface of dielectric layer 113 in the central portion of the structure. Preferably, the work function of the material of layer 115 is relatively low, for example, smaller than or equal to 5 eV, to favor the forming of a vertical inversion channel at the level of the sides of semiconductor layer 103 and thus obtain a two-threshold characteristic of the type shown in FIG. 2.

A step, not shown, of deposition of cathode electrode 105 on top of and in contact with the upper surface of semiconductor layer 101a may further be provided to obtain a structure of the type described in relation with FIG. 1.

FIGS. 4A to 4F are cross-section views illustrating successive steps of another example of a method of manufacturing a semiconductor diode according to an embodiment.

The initial steps of the method of FIGS. 4A to 4F are identical or similar to what has been described in relation with FIGS. 3A to 3C, and will not be detailed again hereafter.

Figure 4A:
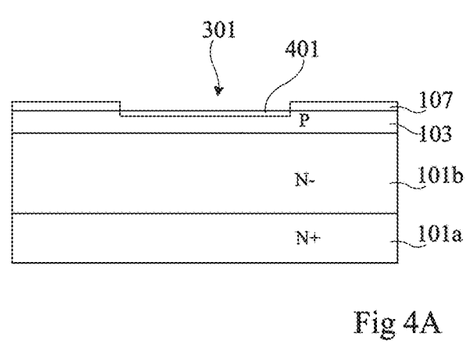
FIGS. 4A to 4F are cross-section views illustrating successive steps of another example of a method of manufacturing a semiconductor diode according to an embodiment.
Figure 4B:
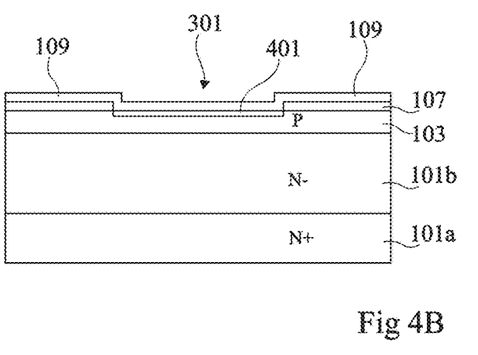
Figure 4C:
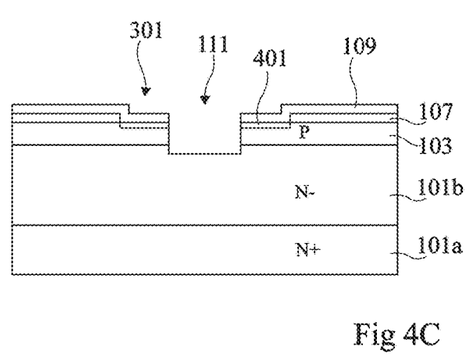
Figure 4D:
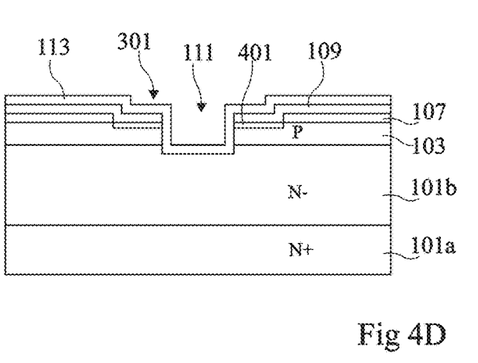
Figure 4E:
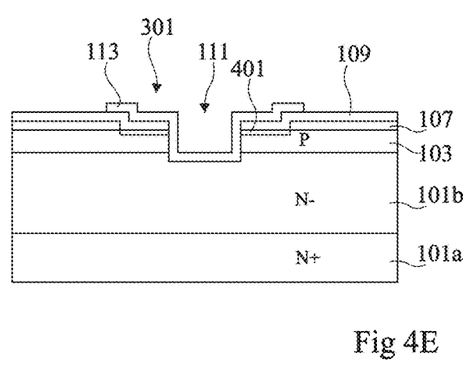
Figure 4F:
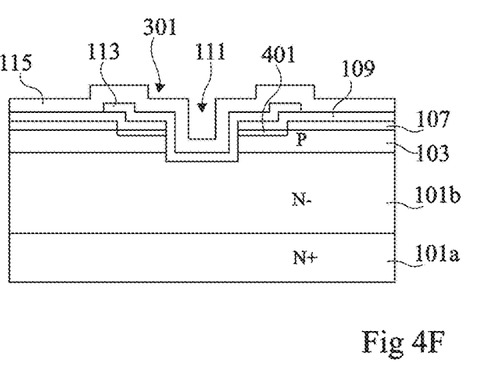

FIG. 4A illustrates the structure obtained at the end of a step of implantation of N-type dopant elements, for example, silicon atoms, in an upper portion of semiconductor layer 103 opposite opening 301. An N-type doped surface region 401 is thus obtained in the upper portion of layer 103. In the shown example, region 401 extends, in top view, over the entire surface of opening 301. As an example, conductive layer 107 is used as a mask during the implantation step to locate region 401 opposite opening 301 only.

The next steps, illustrated in FIGS. 4B to 4F, are similar to what has been described hereabove in relation with FIGS. 3D to 3H, with the difference that, in the example of FIGS. 4A to 4F, conductive layer 109 is in contact, by its lower surface, with the upper surface of region 401 opposite opening 301.

The provision of region 401 enables to improve the quality of the electric contact between conductive layer 109 and semiconductor layer 103.

The thickness of implanted region 401 is for example in the range from 5 nm to 30 nm. The doping level of implanted region 401 is for example in the range from $10^{19}$ atoms/cm$^3$ to $10^{20}$ atoms/cm$^3$.

Figure 5A:
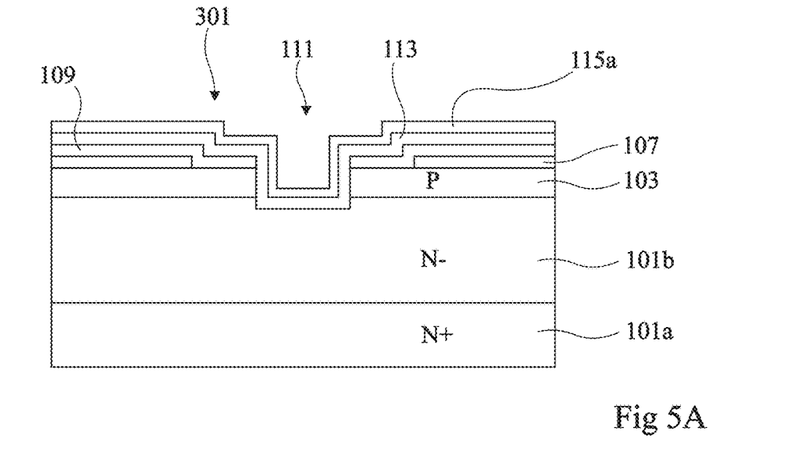
FIGS. 5A to 5C are cross-section views illustrating successive steps of another example of a method of manufacturing a semiconductor diode according to an embodiment.
Figure 5B:
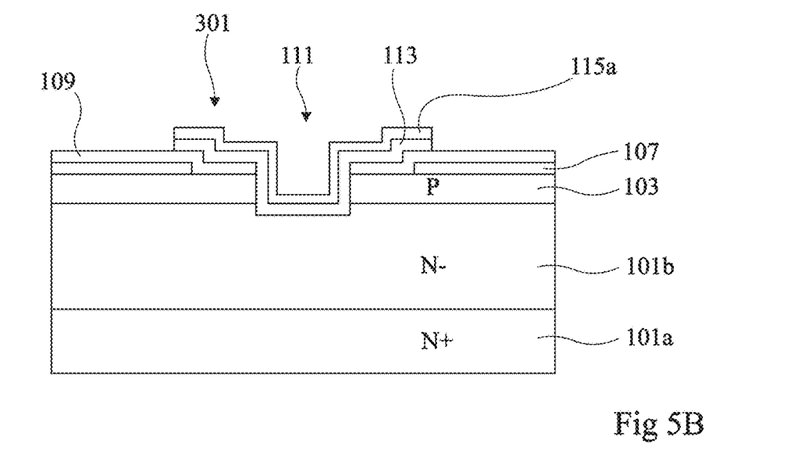
Figure 5C:
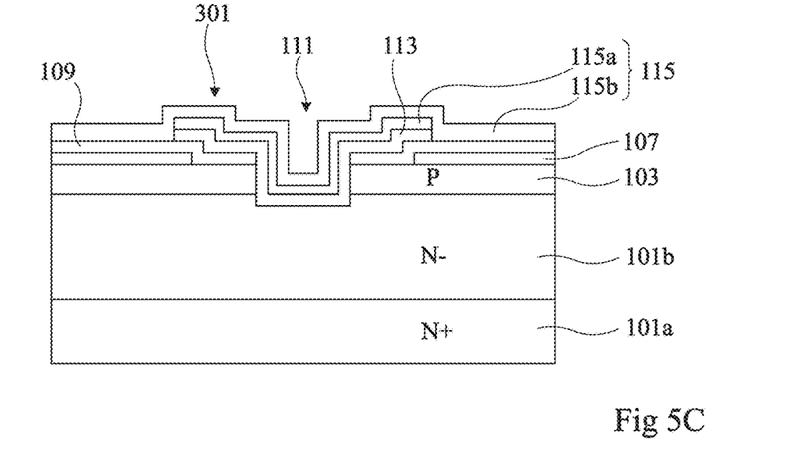

FIG. 5A to 5C are cross-section views illustrating successive steps of another example of a method of manufacturing a semiconductor diode according to an embodiment.

The initial steps of the method of FIGS. 5A to 5C are identical or similar to what has been described in relation with FIGS. 3A to 3F, and will not be detailed again hereafter.

The method of FIGS. 5A to 5C differs from the method of FIGS. 3A to 3H in that, in the method of FIGS. 5A to 5C, a conductive gate layer 115a, for example, of same nature as the layer 115 of the previous examples, is directly deposited after the step of deposition of dielectric layer 113, before the step of local etching of layer 113, to protect layer 113 during the gate etching.

FIG. 5A illustrates the structure obtained at the end of the steps of deposition of dielectric and conductive layers 113 and 115a. At this stage, each of layers 113 and 115a continuously extends, for example, across a substantially uniform thickness over the entire upper surface of the structure.

FIG. 5B illustrates the structure obtained at the end of a step of simultaneous etching (by means of a same mask and according to a same pattern) of layers 113 and 115a, aiming at delimiting the insulated conductive gate of the diode. The etch pattern for example corresponds to the etch pattern of dielectric layer 113 at the step of FIG. 3G.

FIG. 5C illustrates the structure obtained at the end of a step of deposition of an additional conductive layer 115b, for example of same nature as layer 115a, on the upper surface of the structure of FIG. 5B. In this example, layer 115b extends continuously, for example, across a substantially uniform thickness, over the entire upper surface of the structure, that is, on top of and in contact with the upper surface of conductive layer 109 around the gate stack formed by regions 113 and 115a, and on top of and in contact with the upper surface of conductive layer 115a in the central portion of the structure. Regions 115a and 115b form the anode electrode 115 of the diode.

As in the previous examples, a step, not shown, of deposition of cathode electrode 105 on top of and in contact with the lower surface of semiconductor layer 101a may further be provided.

FIGS. 6A to 6H are cross-section views illustrating successive steps of another example of a method of manufacturing a semiconductor diode according to an embodiment.

Figure 6A:
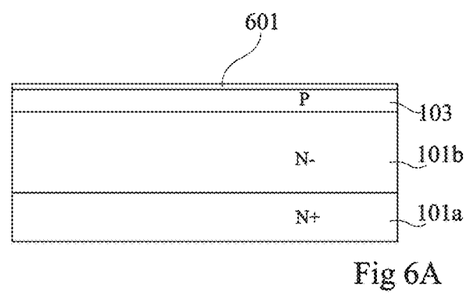
FIGS. 6A to 6H are cross-section views illustrating successive steps of another example of a method of manufacturing a semiconductor diode according to an embodiment.
Figure 6B:
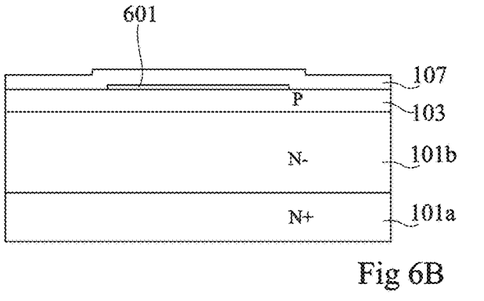
Figure 6C:
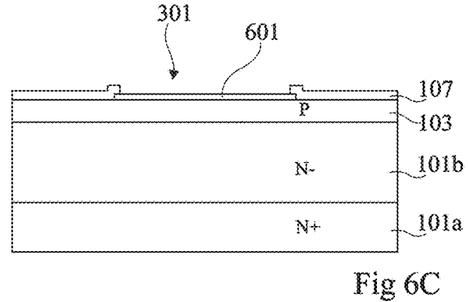
Figure 6D:
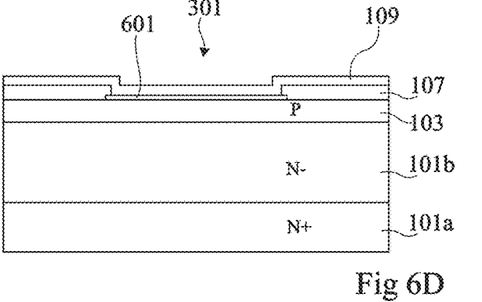
Figure 6E:
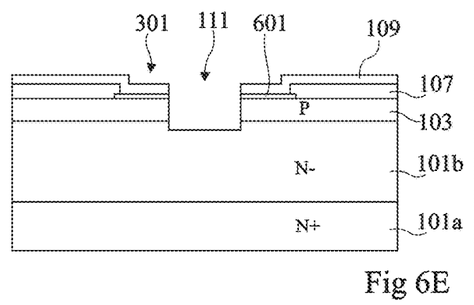
Figure 6F:
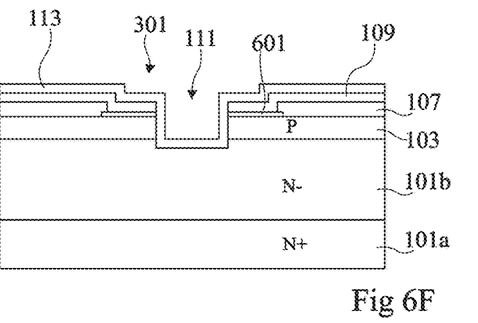
Figure 6G:
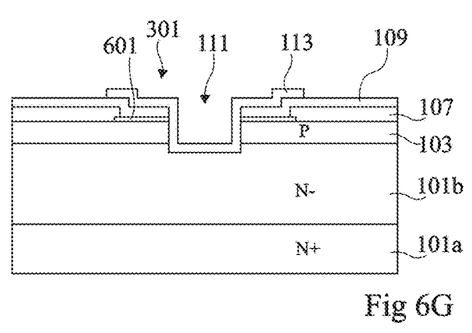
Figure 6H:
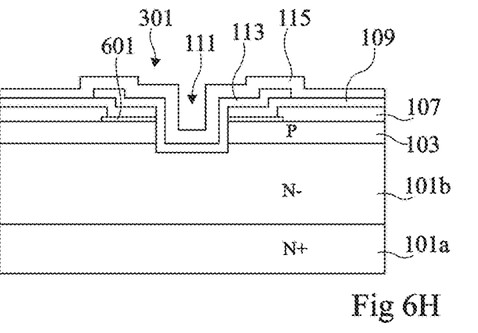

FIG. 6A illustrates the structure obtained at the end of a step of forming an N-type doped semiconductor layer 601 on top of and in contact with the upper surface of a structure of the type described in relation with FIG. 3A. Layer 601 is formed by epitaxy on top of and in contact with the upper surface of P-type semiconductor layer 103. At this stage, layer 601 continuously extends across a substantially uniform thickness over the entire upper surface of layer 103. The thickness of epitaxial layer 601 is for example in the range from 5 nm to 30 nm. The doping level of layer 601 is for example in the range from $10^{19}$ atoms/cm$^3$ to $10^{20}$ atoms/cm$^3$.

A step of local etching of layer 601 is then implemented to remove layer 601 and expose the upper surface of layer 103 at the periphery of the structure, and keep layer 601 opposite a central portion of the structure.

The next steps, illustrated in FIGS. 6B to 6H, are similar to what has been described hereabove in relation with FIGS. 3B to 3H. In the example of FIGS. 6A to 6H, the opening 301 formed in conductive layer 107 is located opposite conductive layer 601. Thus, conductive layer 109 is in contact, by its lower surface, with the upper surface of layer 601 opposite opening 301.

The provision of layer 601 enables, similarly to what has been described in relation with FIGS. 4A to 4F, to improve the quality of the electric contact between conductive layer 109 and semiconductor layer 103.

Various embodiments and variants have been described. Those skilled in the art will understand that certain features of these various embodiments and variants may be combined, and other variants will occur to those skilled in the art.

In particular, the variant of FIGS. 5A to 5C may be combined with the variant of FIGS. 4A to 4F or with the variant of FIG. 6A to 6H.

Further, the described embodiments are not limited to the examples of materials and/or of dimensions mentioned in the present disclosure.

Further, although examples of diodes comprising a single insulated vertical gate structure opposite a central portion of the diode have been shown in the drawings, in practice, a diode according to an embodiment may comprise a plurality of identical or similar insulated vertical gate structures, distributed across the surface of the diode.

The invention claimed is:

1. A semiconductor diode, comprising:
a first doped semiconductor region of a first conductivity type;
a second doped semiconductor region of a second conductivity type opposite to the first conductivity type, arranged on top of and in contact with an upper surface of the first semiconductor region;
a first conductive region arranged on top of and in direct contact with an upper surface of the second semiconductor region, the first conductive region comprising a through opening opposite a portion of the second semiconductor region;
a second conductive region made of a material different from that of the first conductive region, coating and in direct contact with the upper surface of the second semiconductor region opposite said opening;
a cavity extending through the second conductive region and through the second semiconductor region opposite a portion of said opening;
a dielectric region coating the lateral walls and a bottom of the cavity, the dielectric region disposed in direct contact with sides of the second doped semiconductor and with sides of the second conductive region on lateral walls of the cavity, and in direct contact with the first doped semiconductor region at the bottom of the cavity, the dielectric region overlapping the first conductive region and the second conductive region, the dielectric region overlapping the first conductive region and the second conductive region; and
a third conductive region coating the dielectric region on the lateral walls and at the bottom of the cavity, the third conductive region being further electrically in contact with the first conductive region and the second conductive region.

2. The diode according to claim 1, wherein the second conductive region is in contact, by its lower surface, with the upper surface of the second semiconductor region opposite said opening.

3. The diode according to claim 1, wherein a third semiconductor region of the first conductivity type forms an interface between the second conductive region and the second semiconductor region opposite said opening.

4. The diode according to claim 1, wherein the dielectric region covers the upper surface of the second conductive region opposite said opening.

5. The diode according to claim 1, wherein the dielectric region has an equivalent silicon oxide thickness smaller than 5 nm on the lateral walls of the cavity.

6. The diode according to claim 1, wherein the second conductive region has a work function smaller than that of the first conductive region.

7. The diode according to claim 1, wherein the second conductive region has a work function substantially equal to the electron affinity of a material of the second semiconductor region.

8. The diode according to claim 1, wherein the third conductive region has a work function smaller than or equal to 5 eV.

9. The diode according to claim 1, wherein each of the first semiconductor region and the second semiconductor regions comprises gallium nitride.

10. The diode according to claim 1, wherein the first conductive region includes a material selected from the group consisting of platinum, palladium, a nickel-gold alloy, a palladium-gold alloy, and a palladium-nickel-gold alloy.

11. The diode according to claim 1, wherein the second conductive region includes a material selected from the group consisting of titanium, aluminum, or a titanium-aluminum alloy.

12. The diode according to claim 1, wherein the third conductive region is made of titanium nitride.

13. The diode according to claim 1, further comprising a fourth conductive region in contact with a lower surface of the first semiconductor region.

* * * * *